(12) United States Patent
Van Der Ham et al.

(10) Patent No.: US 8,711,326 B2
(45) Date of Patent: Apr. 29, 2014

(54) FLUID HANDLING STRUCTURE, A LITHOGRAPHIC APPARATUS AND A DEVICE MANUFACTURING METHOD

(75) Inventors: Ronald Van Der Ham, Maarheze (NL); Martinus Hendrikus Antonius Leenders, Rhoon (NL); Johannes Catharinus Hubertus Mulkens, Valkenswaard (NL); Richard Moerman, Son (NL); Michel Riepen, Veldhoven (NL); Sergei Shulepov, Eindhoven (NA); Koen Steffens, Veldhoven (NL); Jan Willem Cromwijk, Best (NL); Johanna Antoinette Maria Sondag-Huethorst, Valkenswaard (NL); Marco Baragona, Delft (NL); Robertus Leonardus Maria In 'T Groen, Tilburg (NL); Ralph Theodorus Hubertus Maessen, Herten (NL); Jacob Marinus Jan Den Toonder, Eindhoven (NL); Milica Kovacevic-Milivojevic, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 400 days.

(21) Appl. No.: 13/098,830

(22) Filed: May 2, 2011

(65) Prior Publication Data
US 2011/0292357 A1    Dec. 1, 2011

Related U.S. Application Data

(60) Provisional application No. 61/331,305, filed on May 4, 2010, provisional application No. 61/393,655, filed on Oct. 15, 2010.

(51) Int. Cl.
*G03B 27/32* (2006.01)
*G03B 27/52* (2006.01)
*G03F 7/20* (2006.01)

(52) U.S. Cl.
CPC ........ *G03F 7/70925* (2013.01); *G03F 7/70341* (2013.01); *G03F 7/70* (2013.01)
USPC ............................................... 355/30; 355/77

(58) Field of Classification Search
CPC .... G03F 7/70; G03F 7/70341; G03F 7/70925
USPC ......................................... 355/30, 53, 72, 77
See application file for complete search history.

(56) References Cited

U.S. PATENT DOCUMENTS 4,398,925 A    8/1983   Trinh et al.
(Continued)

FOREIGN PATENT DOCUMENTS

EP    1 420 300    5/2004
(Continued)

OTHER PUBLICATIONS

T.G. Leighton et al., "Primary Bjerknes forces," Eur. J. Phys., vol. 11, pp. 47-50 (1990).

(Continued)

*Primary Examiner* — Toan Ton
*Assistant Examiner* — Colin Kreutzer
(74) *Attorney, Agent, or Firm* — Pillsbury Winthrop Shaw Pittman LLP

(57) ABSTRACT

A fluid handling structure to confine immersion liquid in a space between a projection system and a facing surface of a substrate, of a table to support the substrate, or both, is disclosed. The fluid handling structure includes a transponder to dissolve at least some of the gas in a bubble in the immersion liquid or to control a bubble in the immersion liquid so that it avoids entering an optical path of a beam from the projection system.

20 Claims, 9 Drawing Sheets

(56) References Cited

U.S. PATENT DOCUMENTS

| | | | |
|---|---|---|---|
| 4,509,852 A | 4/1985 | Tabarelli et al. | |
| 7,684,008 B2 | 3/2010 | De Smit et al. | |
| 2004/0136494 A1 | 7/2004 | Lof et al. | |
| 2004/0207824 A1 | 10/2004 | Lof et al. | |
| 2005/0024609 A1 | 2/2005 | De Smit et al. | |
| 2005/0048223 A1* | 3/2005 | Pawloski et al. | 427/600 |
| 2005/0225734 A1* | 10/2005 | De Smit et al. | 355/30 |
| 2006/0028628 A1* | 2/2006 | Lin et al. | 355/30 |
| 2006/0038968 A1 | 2/2006 | Kemper et al. | |
| 2006/0103816 A1* | 5/2006 | Belfroid et al. | 355/30 |
| 2006/0110689 A1* | 5/2006 | Chang | 430/327 |
| 2006/0119809 A1 | 6/2006 | Verhagen et al. | |
| 2006/0250588 A1* | 11/2006 | Brandl | 355/30 |
| 2008/0186460 A1* | 8/2008 | Auer-Jongepier et al. | 355/30 |
| 2009/0015804 A1* | 1/2009 | De Jong et al. | 355/30 |
| 2009/0279062 A1 | 11/2009 | Direcks et al. | |
| 2011/0199591 A1* | 8/2011 | Sato | 355/30 |

FOREIGN PATENT DOCUMENTS

| | | |
|---|---|---|
| JP | 7-016402 | 1/1995 |
| JP | 10-066802 | 3/1998 |
| JP | 11-290611 | 10/1999 |
| JP | 2005-286068 | 10/2005 |
| JP | 2007-136928 | 6/2007 |
| JP | 2007-142217 | 6/2007 |
| JP | 2007-311671 | 11/2007 |
| JP | 2008-010892 | 1/2008 |
| JP | 2009-088227 | 4/2009 |
| JP | 2009-170709 | 7/2009 |
| WO | 9949504 | 9/1999 |
| WO | 2005/064405 | 7/2005 |

OTHER PUBLICATIONS

Ismail I. Kashkoush, "The Use of Ultrasound Energy in Photoresist Stripping Applications," Electrochemical Society Proceedings, vol. 95-20, pp. 90-98.

Anil J. Reddy et al., "Coupled dynamics of translation and collapse of acoustically driven microbubbles," J. Acoust. Soc. Am., vol. 112, No. 4, pp. 1346-1352 (Oct. 2002).

Japanese Office Action mailed Feb. 22, 2013 in corresponding Japanese Patent Application No. 2011-099033.

Japanese Office Action mailed Jul. 30, 2012 in corresponding Japanese Patent Application No. 2011-099033.

* cited by examiner

FLUID HANDLING STRUCTURE, A LITHOGRAPHIC APPARATUS AND A DEVICE MANUFACTURING METHOD

This application claims priority and benefit under 35 U.S.C. §119(e) to U.S. Provisional Patent Application Ser. No. 61/331,305, entitled "A Fluid Handling Structure and A Lithographic Apparatus", filed on May 4, 2010, and to U.S. Provisional Patent Application Ser. No. 61/393,655, entitled "A Fluid Handling Structure, A Lithographic Apparatus and A Device Manufacturing Method", filed on Oct. 15, 2010. The contents of those applications are incorporated herein in their entirety by reference.

FIELD

The present invention relates to a fluid handling structure, a lithographic apparatus and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, device structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a bather to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

SUMMARY

In immersion lithography, a bubble present in immersion liquid may be a source of imaging errors or defectivity.

It is desirable to alleviate defectivity by reducing, if not preventing, a bubble from entering the optical path of a projection beam during exposure.

In an embodiment, there is provided a fluid handling structure to confine immersion liquid in a space between a projection system and a facing surface of a substrate, of a table to support the substrate, or both, the fluid handling structure comprising a transducer to dissolve at least some of the gas in a bubble in the immersion liquid, the fluid handling structure having an undersurface.

In an embodiment, there is provided a fluid handling structure to confine immersion liquid in a space between a projection system and a facing surface of a substrate, of a table to support the substrate, or both, the fluid handling structure comprising a transducer to prevent a bubble in the immersion liquid from entering the immersion space, the fluid handling structure having an undersurface.

In an embodiment, there is provided a fluid handling structure to confine immersion liquid in a space between a projection system and a facing surface of a substrate, of a table to support the substrate, or both, the fluid handling structure comprising a transducer to control a bubble in the immersion liquid so that it avoids entering an optical path of a projection beam from the projection system, the transducer being located in an undersurface of the fluid handling structure radially inward of an extraction opening formed in the undersurface.

In an embodiment, there is provided a device manufacturing method comprising projecting, onto a substrate, a patterned beam of radiation along an optical path through an immersion liquid confined by a fluid handling structure to a space between a projection system and the substrate, and using sonic waves to dissolve at least some of the gas in a bubble in the immersion liquid and/or to prevent a bubble in the immersion liquid from entering the optical path.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
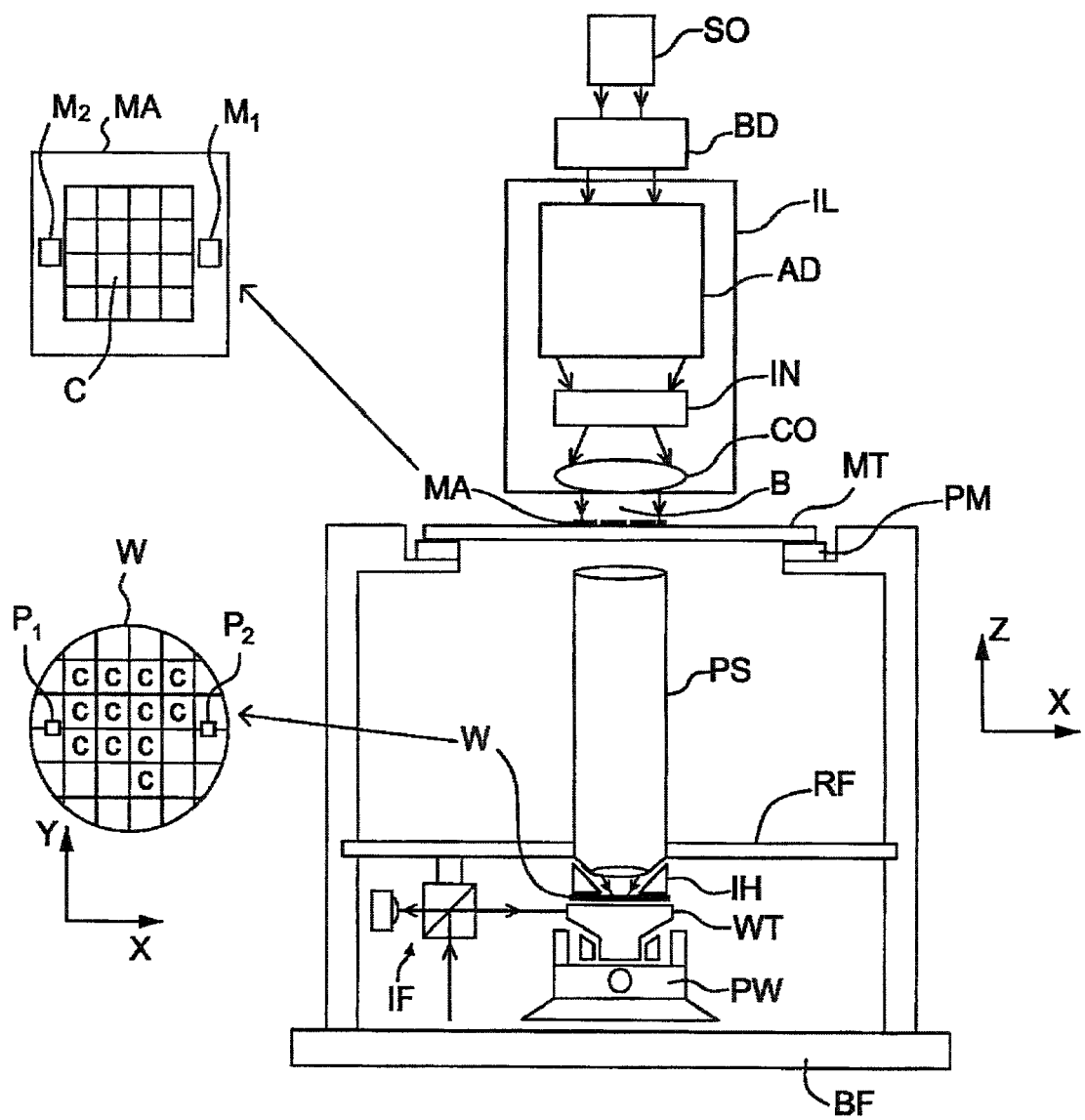
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

a substrate table (e.g. a wafer table) WT constructed to hold a substrate (e.g. a resist-coated wafer) W and connected to a second positioner PW configured to accurately position the substrate W in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more tables at least one or all of which may hold a substrate (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system and the substrate can be classed into at least two general categories. These are the bath type arrangement and the so called localized immersion system. In the bath type arrangement substantially the whole of the substrate and optionally part of the substrate table is submersed in a bath of liquid. The so called localized immersion system uses a liquid supply system in which liquid is only provided to a localized area of the substrate. In the latter category, the space filled by liquid is smaller in plan than the top surface of the substrate and the area filled with liquid remains substantially stationary relative to the projection system while the substrate moves underneath that area. A further arrangement, to which an embodiment of the invention is directed, is the all wet solution in which the liquid is unconfined. In this arrangement substantially the whole top surface of the substrate and all or part of the substrate table is covered in immersion liquid. The depth of the liquid covering at least the substrate is small. The liquid may be a film, such as a thin film, of liquid on the substrate. Any of the liquid supply devices of FIGS. 2-5 may be used in such a system; however, sealing features are not present, are not activated, are not as efficient as normal or are otherwise ineffective to seal liquid to only the localized area. Four different types of localized liquid supply systems are illustrated in FIGS. 2-5.

Figure 2:
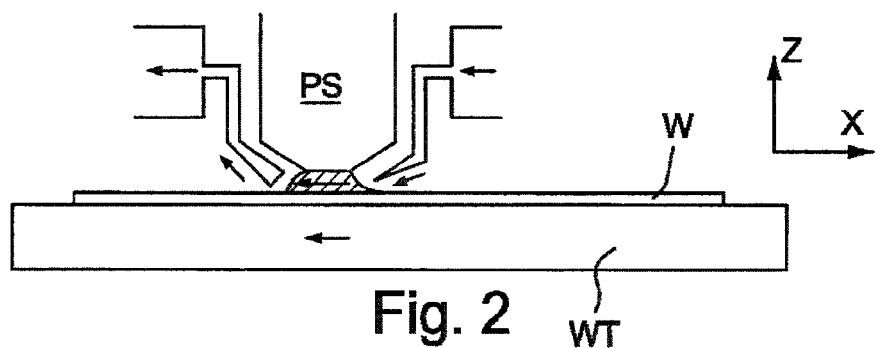
FIGS. 2 and 3 depict a liquid supply system for use in a lithographic projection apparatus.
Figure 3:
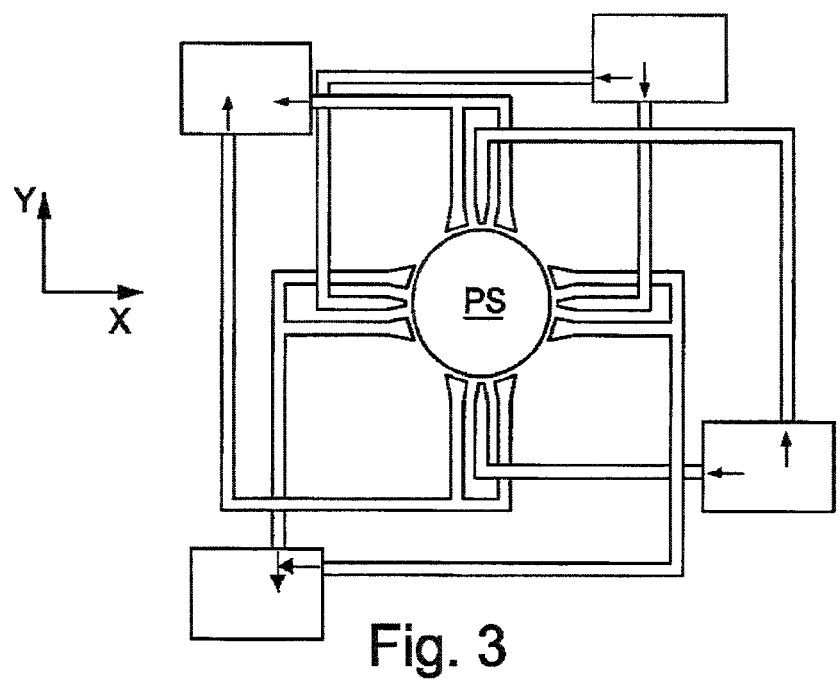

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet onto the substrate, desirably along the direction of movement of the substrate relative to the final element, and is removed by at least one outlet after having passed under the projection system. That is, as the substrate is scanned beneath the element in a –X direction, liquid is supplied at the +X side of the element and taken up at the –X side. FIG. 2 shows the arrangement schematically in which liquid is supplied via inlet and is taken up on the other side of the element by outlet which is connected to a low pressure source. The arrows above the substrate W illustrate the direction of liquid flow, and the arrow below the substrate W illustrates the direction of movement of the substrate table. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element. Arrows in liquid supply and liquid recovery devices indicate the direction of liquid flow.

Figure 4:
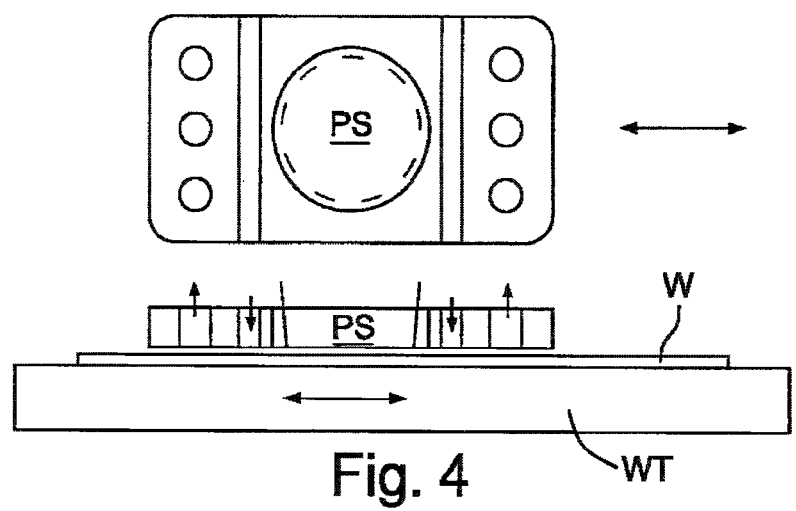
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets and outlets can be arranged in a plate with a hole in its center and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). In the cross-sectional view of FIG. 4, arrows illustrate the direction of liquid flow in inlets and out of outlets.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. In an arrangement, the apparatus has only one table, or has two tables of which only one can support a substrate.

PCT patent application publication no. WO 2005/064405 discloses an all wet arrangement in which the immersion liquid is unconfined. In such a system the whole top surface of the substrate is covered in liquid. This may be advantageous because then the whole top surface of the substrate is exposed to the substantially same conditions. This has an advantage for temperature control and processing of the substrate. In WO 2005/064405, a liquid supply system provides liquid to the gap between the final element of the projection system and the substrate. That liquid is allowed to leak (or flow) over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States patent application publication no. US 2006/0119809. A member is provided which covers the substrate in all positions and which is arranged to have immersion liquid extending between it and the top surface of the substrate and/or substrate table which holds the substrate.

Figure 5:
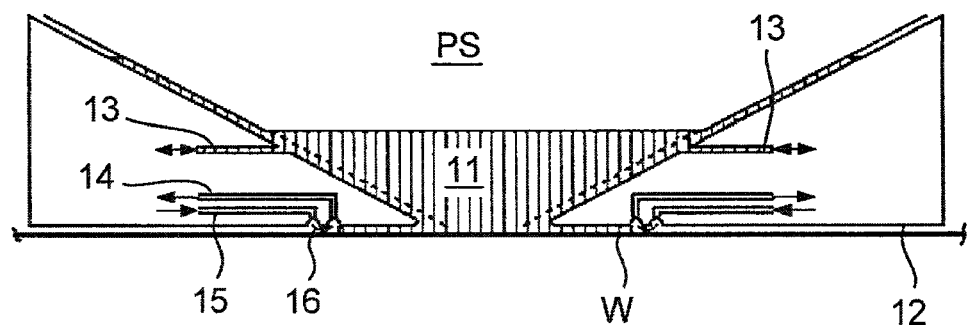
FIG. 5 depicts a further liquid supply system for use in a lithographic projection apparatus.

Another arrangement which has been proposed is to provide the liquid supply system with a fluid handling structure. The fluid handling structure may extend along at least a part of a boundary of the space between the final element of the projection system and the substrate table. Such an arrangement is illustrated in FIG. 5. The fluid handling structure is substantially stationary relative to the projection system in the XY plane though there may be some relative movement in the Z direction (in the direction of the optical axis). A seal is formed between the fluid handling structure and the surface of the substrate. In an embodiment, a seal is formed between the fluid handling structure and the surface of the substrate and may be a contactless seal such as a gas seal. Such a system is disclosed in United States patent application publication no. US 2004-0207824. In another embodiment the fluid handling structure has a seal which is a non-gaseous seal, and so may be referred to as a liquid confinement structure.

FIG. 5 schematically depicts a localized liquid supply system or fluid handling structure or device with a body 12 forming a barrier member or liquid confinement structure, which extends along at least a part of a boundary of the space 11 between the final element of the projection system PS and the substrate table WT or substrate W. (Please note that reference in the following text to surface of the substrate W also refers in addition or in the alternative to a surface of the substrate table WT, unless expressly stated otherwise.) The liquid handling structure is substantially stationary relative to the projection system PS in the XY plane though there may be some relative movement in the Z direction (generally in the direction of the optical axis). In an embodiment, a seal is formed between the body 12 and the surface of the substrate W and may be a contactless seal such as a gas seal or fluid seal.

The fluid handling structure at least partly contains liquid in the space 11 between a final element of the projection system PS and the substrate W. A contactless seal, such as a gas seal 16, to the substrate W may be formed around the image field of the projection system PS so that liquid is confined within the space 11 between the substrate W surface and the final element of the projection system PS. The space 11 is at least partly formed by the body 12 positioned below and surrounding the final element of the projection system PS. Liquid is brought into the space 11 below the projection system PS and within the body 12 by liquid inlet 13. The liquid may be removed by liquid outlet 13. The body 12 may extend a little above the final element of the projection system PS. The liquid level rises above the final element so that a buffer of liquid is provided. In an embodiment, the body 12 has an inner periphery that at the upper end closely conforms to the shape of the projection system PS or the final element thereof and may, e.g., be round. At the bottom, the inner periphery closely conforms to the shape of the image field, e.g., rectangular, though this need not be the case. The inner periphery may be any shape, for example the inner periphery may conform to the shape of the final element of the projection system. The inner periphery may be round.

The liquid is contained in the space 11 by the gas seal 16 which, during use, is formed between the bottom of the body 12 and the surface of the substrate W. The gas seal 16 is formed by gas, e.g. air or synthetic air but, in an embodiment, $N_2$ or another inert gas. The gas in the gas seal 16 is provided under pressure via inlet 15 to the gap between body 12 and substrate W. The gas is extracted via outlet 14. The overpressure on the gas inlet 15, vacuum level on the outlet 14 and geometry of the gap are arranged so that there is a high-velocity gas flow inwardly that confines the liquid. The force of the gas on the liquid between the body 12 and the substrate W contains the liquid in a space 11. The inlets/outlets may be annular grooves which surround the space 11. The annular grooves may be continuous or discontinuous. The flow of gas is effective to contain the liquid in the space 11. Such a system is disclosed in United States patent application publication no. US 2004-0207824.

The example of FIG. 5 is a so called localized area arrangement in which liquid is only provided to a localized area of the top surface of the substrate W at any one time. Other arrangements are possible, including fluid handling structures which make use of a single phase extractor or a two phase extractor as disclosed, for example, in United States patent application publication no US 2006-0038968. In an embodiment, a single or two phase extractor may comprise an inlet which is covered in a porous material. In an embodiment of a single phase extractor the porous material is used to separate liquid from gas to enable single-liquid phase liquid extraction. A chamber downstream of the porous material is maintained at a slight under pressure and is filled with liquid. The under pressure in the chamber is such that the meniscuses formed in the holes of the porous material prevent ambient gas from being drawn into the chamber. However, when the porous surface comes into contact with liquid there is no meniscus to restrict flow and the liquid can flow freely into the chamber. The porous material has a large number of small holes, e.g. of diameter in the range of 5 to 300 μm, desirably 5 to 50 μm. In an embodiment, the porous material is at least slightly lyophilic (e.g., hydrophilic), i.e. having a contact angle of less than 90° to the immersion liquid, e.g. water.

Many other types of liquid supply system are possible, for example a gas drag arrangement where a liquid meniscus is pinned at outlet openings by two phase extraction such as is disclosed in United States patent application publication no. US 2009-0279062, hereby incorporated in its entirety by reference. The present invention is not limited to any particular type of liquid supply system. The present invention may be advantageous for use with a confined immersion system in which the liquid between the final element of the projection system and the substrate is confined, for example, in optimizing the use. However, the invention can be used with any other type of liquid supply system.

A bubble may be formed in immersion liquid present in an immersion space between the projection system and a facing surface (of a substrate, of a table (for example, supporting the substrate), or both) in several ways. A droplet of liquid may collide with the meniscus between the fluid handling structure and the facing surface to include a bubble in the immersion space. The bubble may be introduced with the liquid through a liquid supply opening. The bubble may form from dissolved gas present in the immersion system. When such a bubble interferes with the projection beam, for example when the bubble is entrained in the immersion liquid or it is in contact with a portion of the facing surface of the substrate, the defectivity of the substrate may increase. The image formed on the substrate by the projection beam may be affected, e.g. distorted, so that a resulting semi-conductive component may be defective.

On occasion the bubble may be attached to the substrate. The transportation speed of bubble may be faster than expected because the relative speed between the substrate and the projection system may be up to 1 m/s or more.

Measures have been taken to: reduce the risk and effect of droplet collision, and adjust the composition of the immersion liquid by reducing the quantity of bubbles in the liquid when it is supplied and reducing the concentration of dissolved gas. However, it may be desirable to reduce the risk of a bubble interfering with the projection beam during exposure further.

Sonic emission may be used to control a bubble of gas in liquid, for example by manipulating a bubble suspended in a liquid using ultrasound (See T. G. Leighton, A. J. Walton and M. J. W. Pickworth, Eur. J. Physics 11, 47-50 (1990) which is hereby incorporated by reference in its entirety). Such sonic emission may prevent a bubble from entering the immersion liquid in the space through which the projection beam may travel by dissolving the bubble. In an embodiment, the sonic emission may be used to block the passage of a bubble into the optical path.

As described herein, the passage of a bubble into the space is along a passage, for example an immersion liquid supply conduit or between the fluid extraction structure and a facing surface (of a table, of a substrate, or both, facing the projection system PS). Generally reference herein will be to the passage between the fluid handling structure 12 and the facing surface. Such reference is intended to include other passages by which a bubble may enter the space 11 between the projection system PS and a facing surface, such as between the projection system PS and a surface of the fluid handling structure 12.

When a bubble enters the immersion liquid between the fluid handling system 12 and the facing surface, the bubble travels in the immersion liquid a period of time before the bubble passes out from under the fluid handling structure 12 into the rest of the immersion space 11. Gas from the bubble may dissolve into the immersion liquid and reduce in size. Therefore a bubble of a certain size will be fully dissolved before it would reach the liquid in the optical path of the projection beam. In an embodiment it is expected that a bubble less than four micrometers (<4 μm) would fully dissolve before reaching the optical path, for example between formation of the bubble at the meniscus and the actual exposure field. Calculations of bubble lifetime over a range of bubble sizes, for example between 1 and 13 micrometers, have been made to support the minimum bubble size. The calculations have been made for surfaces with different liquid contact angles, for example with respect to water, at 4, 45 and 90 degrees. The calculations considered a scan speed of 600 mm/s and that the bubble should dissolve by the time it arrives in the optical path, for example a travel time of less than 0.01 seconds, desirably less than 0.0075 seconds.

Sonic emission (e.g. acoustic energy) at a resonant frequency of the contained immersion liquid can be used to drive the bubble to a point where it can coalesce with another bubble. See, e.g., U.S. Pat. No. 4,398,925, which is hereby incorporated by reference in its entirety. Coalescing bubbles may be desirable because small bubbles may be difficult to remove and a larger bubble may be easier to remove, for example if the bubbles are coalesced in a location for extraction.

Some small bubbles may be difficult to control by conglomeration, for example small bubbles larger than 4 micrometers. Instead of coalescing small bubbles, such a small bubble may be removed by applying a sonic emission at an appropriate frequency. In one embodiment the frequency used to dissolve the bubble may be at or close to the resonant frequency of the bubble. The sonic emission causes oscillation of the bubble so as to produce rapid flow of liquid about each bubble. The gas in the bubble may dissolve, sometimes rapidly, into the liquid. The oscillation also can be useful in breaking up a larger bubble into smaller ones that can be more readily dissolved into the liquid.

Figure 6:
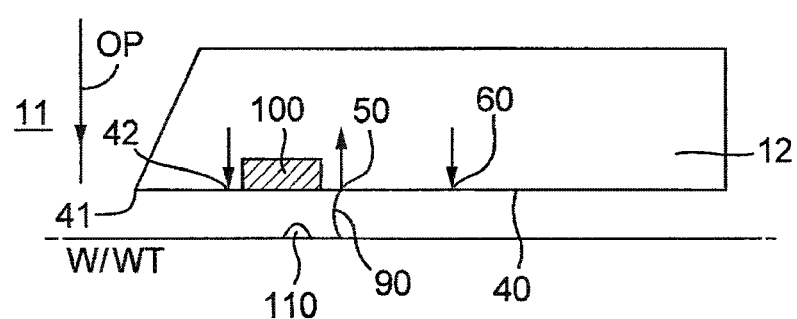
FIG. 6 is a cross-sectional schematic side view of a fluid handling structure according to an embodiment of the invention.

It may be desirable to dissolve a bubble present in immersion liquid before it reaches the liquid in the immersion space 11, such as the optical path. An arrangement, as shown in FIG. 6, is a cross-section of a fluid handling structure 12. In the undersurface 40 of the fluid handling structure 12, in increasing distance from the optical path OP, are a number of features which may include: a supply opening 42 to supply immersion liquid underneath the fluid handling structure 12, an extraction opening 50 to remove immersion liquid (for example in a two phase flow of liquid), and a gas opening 60 to supply gas (which may form in use a gas knife).

The extraction opening 50 may serve to pin a meniscus 90 between the undersurface of the fluid handling structure 12 and the facing surface. In an embodiment, the extraction opening 50 extracts immersion liquid in a single phase fluid flow. The opening 50 may have a porous member facilitating extraction in a single phase.

A transducer 100 which may emit a sonic emission at a resonance frequency of a bubble 110 may be located on the fluid handling structure 12 so as to interact with the bubble 110 before the bubble 110 enters the space 11, undesirably the optical path. The transducer 100 may cause a bubble to dissolve in the immersion liquid before it passes out from under the fluid handling structure 12.

The transducer 100 may be in the form of a sonic emitter 100. The transducer may be located on the undersurface 40 of the fluid handling structure 12. In an embodiment the transducer 100 is located radially inward of the extraction opening 50. In an embodiment the transducer 100 may be located between the extraction opening 50 and the supply opening 42, as shown in FIG. 6.

Figure 7:
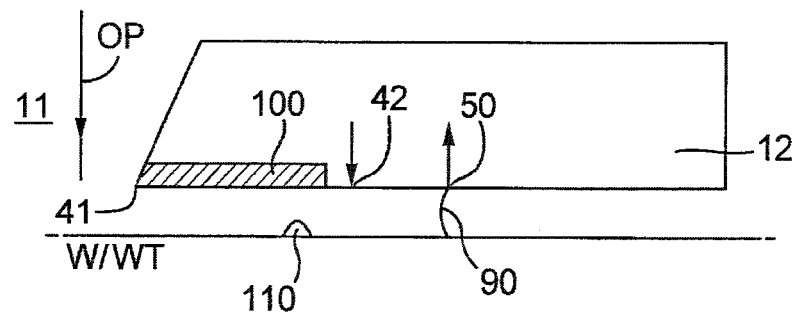
FIG. 7 is a cross-sectional schematic side view of a fluid handling structure according to an embodiment of the invention.

In an embodiment, the transducer 100 may be located radially inwardly of the supply opening 42 in the undersurface 40. In an embodiment the transducer 100 is a portion of the undersurface 40 radially outward of the immersion space 11, for example radially outwardly of a radially inward edge 41 of the undersurface 40. Such an arrangement is shown in FIG. 7. In such an arrangement there may also be a transducer 100 between the extraction opening 50 and the supply opening 42. However, a bubble 110 may be supplied through the supply opening 42. Such a bubble would pass a transducer 100 radially inward of the supply opening 42 but not radially outward of the supply opening 42. Therefore having the transducer 100 at the location shown in FIG. 7 is more desirable than having the transducer 100 only radially outward of the supply opening 42: all bubbles 110 traveling radially inwardly would have to pass the transducer 100. It is desirable to have the transducer 100 present at both locations for certain operation settings. As described herein, the transducer 100 will have a longer time influence on a bubble 110 traveling from the meniscus 90 to the optical path OP than having the transducer 100 at just one of these two locations.

Figure 8:
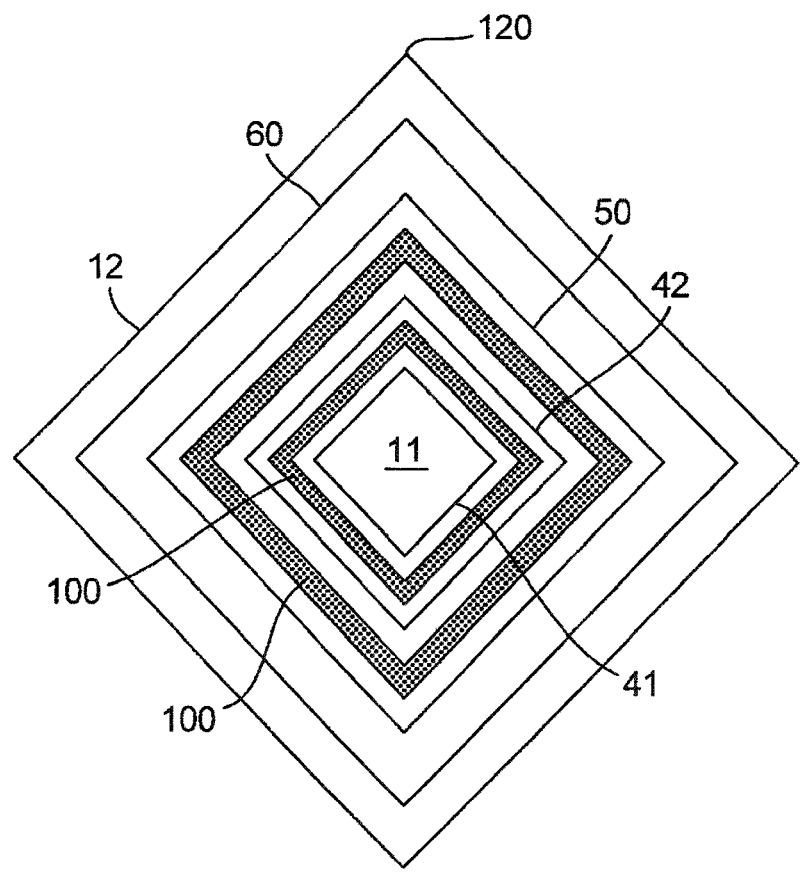
FIG. 8 is schematic plan view of a fluid handling structure according to an embodiment of the invention.
Figure 9:
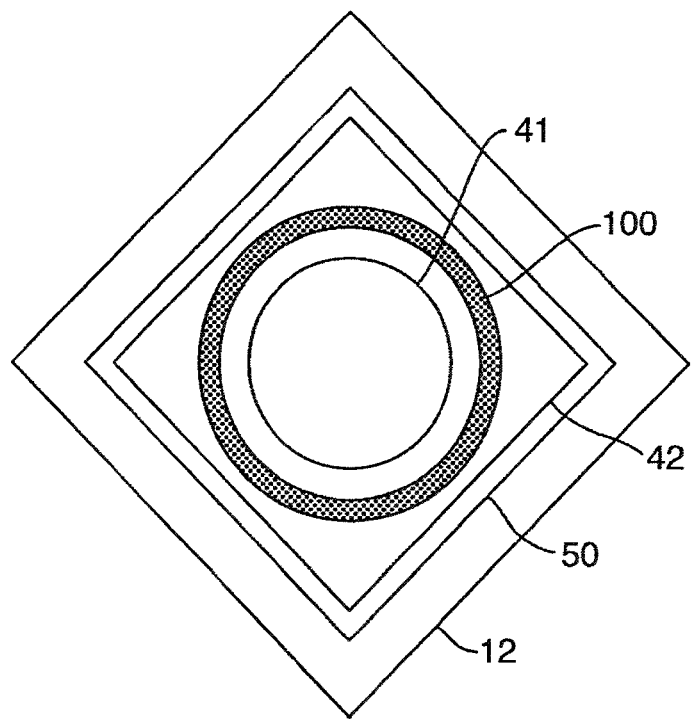
FIG. 9 is schematic plan view of a fluid handling structure according to an embodiment of the invention.

The transducer 100 may be around the periphery, for example the circumference, of the immersion space 11. Therefore a bubble 110 approaching from any direction may be controlled by sonic emissions from the transducer 100. In an embodiment the transducer 100 is circular, quadrilateral or rectilinear, in plan. See FIGS. 8 and 9.

The location or direction of approach of a bubble 110 towards the immersion space 11 may be determined by the design of the fluid handling structure 12 and/or the selected relative movement between the fluid handling structure 12 and the facing surface. For a certain relative movement between the facing surface and the fluid handling structure 12 there may be an increased risk of a bubble 110 escaping from between the facing surface and the undersurface 40 of the fluid handling structure 12 into the immersion space 11. The transducer 100 may be located at a location on an undersurface 40 so that a sonic emission emitted from the transducer 100 may prevent the bubble 110 from entering the optical path OP. Such a location may be aligned with a preferred direction of relative motion, such as a scanning or stepping direction. Such a direction may be aligned with a corner 120 of the fluid handling structure 12, when viewed in plan (see FIG. 8).

Figure 10:
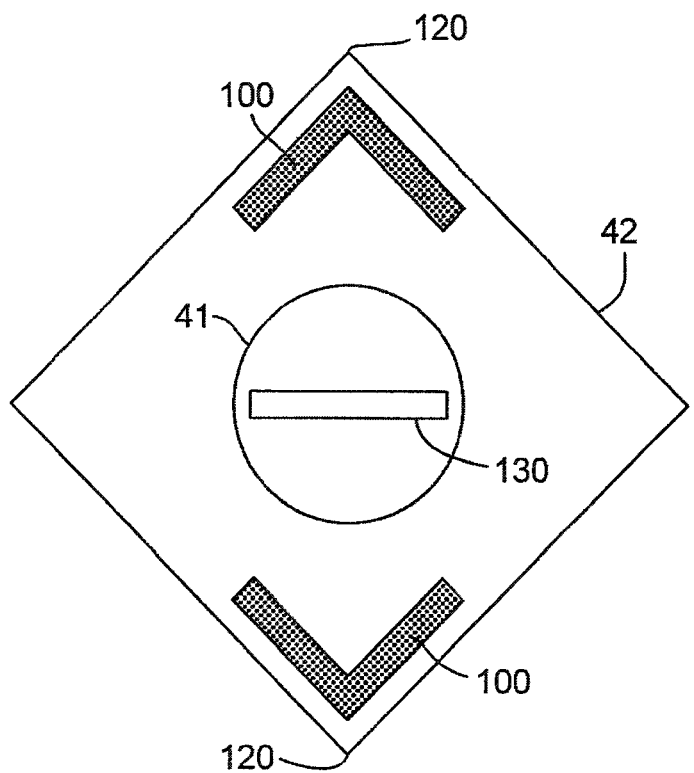
FIG. 10 is schematic plan view of a fluid handling structure according to an embodiment of the invention.
Figure 11:
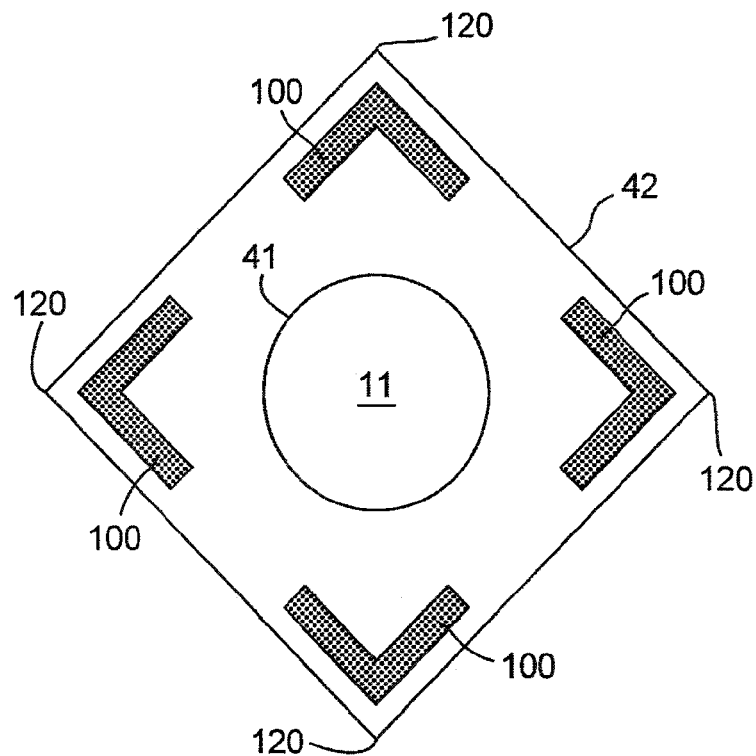
FIG. 11 is schematic plan view of a fluid handling structure according to an embodiment of the invention.

The dimension length component of the transducer 100, for example in a direction perpendicular to the scanning direction, may correspond to at least the imaging slit 130 through which the projection beam B passes during exposure. Such a dimension helps to ensure that a bubble present in the liquid is at least prevented from entering immersion liquid which may pass through the optical path OP of the projection beam B. See FIG. 10 which shows an arrangement with just two corners 120 (top and bottom corners, as illustrated) associated with the preferred direction of travel and FIG. 11 which shows transducers 100 associated with each of four corners 120.

Figure 12:
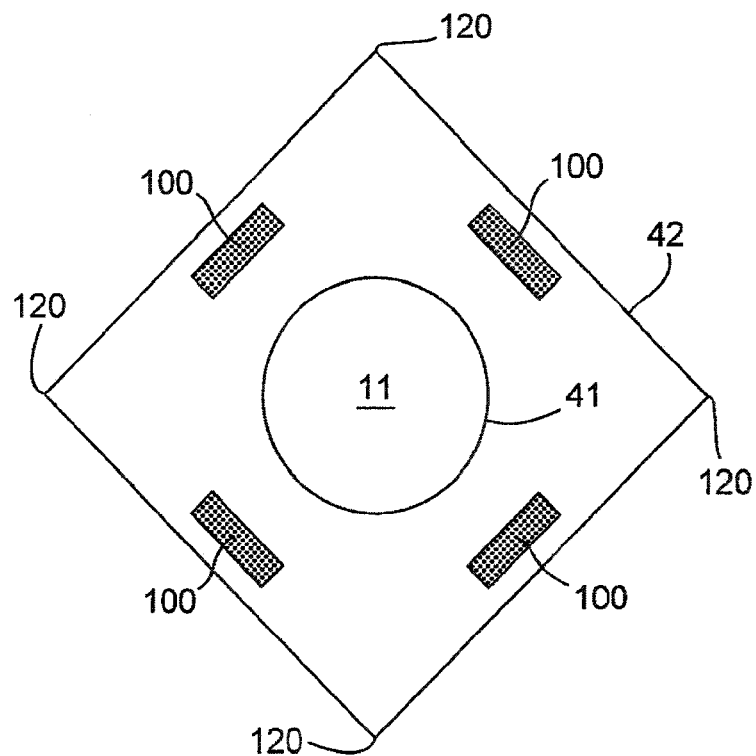
FIG. 12 is schematic plan view of a fluid handling structure according to an embodiment of the invention.

In an embodiment the transducer 100 is located at a region about the midpoint between preferred directions of relative travel, such as corresponding to corners 120. Such a transducer 100 may help prevent a bubble 110 which would enter the immersion liquid during a turning motion, for example between scanning moves or between a scanning and a stepping move. See FIG. 12.

Figure 13:
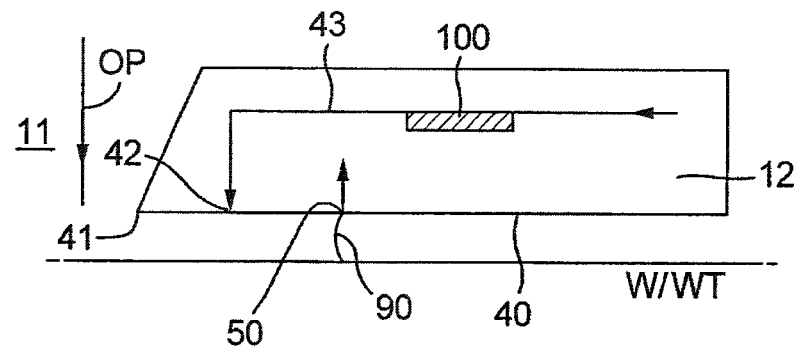
FIG. 13 is a cross-sectional schematic side view of a fluid handling structure according to an embodiment of the invention.

As shown in FIG. 13 the transducer 100 may be located in a fluid line 43 leading to the supply opening 42. In this position gas may be removed from the liquid before the liquid is introduced into the gap between the fluid handling structure 12 and the facing surface. Gas may be removed from the liquid before it can reach space 11.

The above mentioned arrangements cause a bubble 110 to dissolve before entering the optical path OP of the projection beam B. To ensure that a bubble 110 in the liquid, which is directed from the meniscus 90 underneath the fluid handling structure 12 towards the optical path OP, does not reach the optical path OP, the bubble should experience the sonic emission for a period of time. The period of time may correspond to the length of time a bubble 110 takes in traveling underneath the fluid handling structure 12 to the immersion space 11. The period of time may be related to a critical length which is dependent on the scan speed which is the relative speed between the fluid handling structure 12 and the facing surface. The critical length may be the distance of travel which may be required at a certain scan speed for a bubble 110 to dissolve. The critical length may be proportional to the time period for a bubble 110 to dissolve. The period for a bubble 110 to dissolve may be a product of the critical length and the scan speed.

For a given critical length and scan speed, the period of time may be varied by changing the intensity of the sonic emission. By increasing the intensity for a certain critical scan speed, the time it takes a bubble 110 of a certain size to dissolve may decrease. Therefore by increasing the intensity, the operation of the transducer 100 may be decreased to dissolve a bubble 110 of a certain size, the length of relative movement may be decreased, or both.

The transducer 100 may operate during exposure. During exposure a coated substrate W may be present on a substrate support of a substrate table WT. One or more coatings on the substrate W may be sensitive to the sonic emissions. Sensitivity may be dependent on frequency. Therefore, to avoid or reduce any undesirable effect or even damage to the substrate coating, the sonic emissions are above a certain frequency at which a coating on the substrate W has no, or a reduced, sensitivity.

Substrate coatings may be sensitive to sonic emissions, which may be damaging, in the 25-100 kHz range. In the semiconductor industry, frequencies of greater than >400 kHz, typically more than 850 kHz, such as 1 MHz, are used to remove particles from substrates W, for example when they are stacked. It should be noted that sonic emissions in the ultrasonic and mega-sonic range may remove a substrate coating, such as a resist at 40 kHz within 15 s (see, for example, "The use of ultrasound energy in photo-resist stripping applications", Ismail I. Kashkoush, Electrochemical Society Proceedings Volume 95-20, pp. 90-93). The efficiency of coating removal may decrease with increasing frequency, for example 65-100 kHz. At 850 kHz no coating removal may be observed (but the coating removal could occur at elevated temperature and sonic power). Therefore at appropriate operating settings, and at usual speeds of relative motion between the projection system PS and the facing surface, the risk of damage to the substrate coating may be reduced. At such operating conditions the transducer 100 may operate above 850 kHz, desirably above 1 MHz.

In an embodiment, the sonic emitter, for example at an ultrasound frequency, may be used to control a bubble 110 in the immersion liquid, for example, from entering the optical path OP, desirably the space 11 from the direction of a meniscus 90 between the fluid handling structure 12 and the facing surface.

Figure 14:
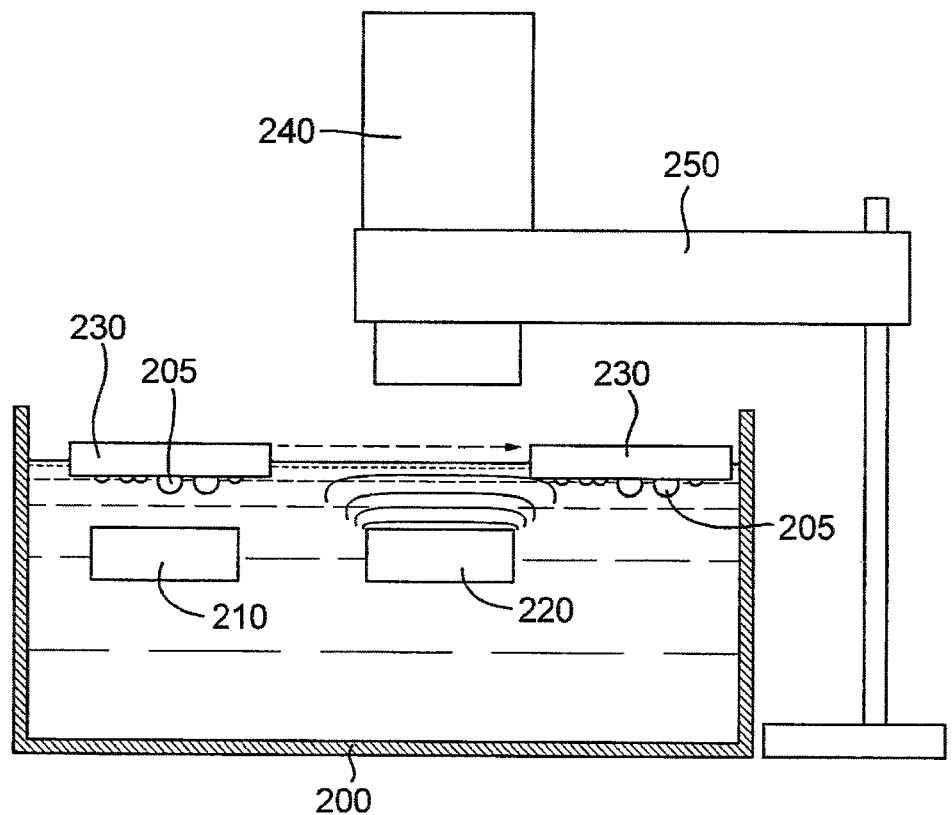
FIG. 14 is an experimental apparatus to block movement of a bubble on a surface using ultrasonic waves.

The feasibility of the concept has been evaluated by experiment and numerical simulation. A suitable experimental arrangement is shown in FIG. 14. Bubbles of micro-dimensions are generated (a size range of 30-200 µm was observed, but bubbles under 30 µm in diameter were not detectable with the experimental set up used) by a first ultrasonic transducer 210 situated in a bath 200 of liquid such as water. Bubbles 205 may be generated below a transparent slide 230, for example made of glass. The bubbles 205 attach to the slide 230 positioned above the first ultrasonic transducer 210. With a controlled velocity, the glass slide 230 is moved towards and over a second transducer 220 in the bath 200. The second transducer 220 generates an ultrasonic pressure field. The effect on the bubbles 205 is observed in-situ using a high-speed camera 240. The camera may be mounted on a microscope 250. The experiment is considered successful when the bubbles are stopped from moving with the slide 230 and are kept steady, e.g., stationary, in the acoustic field. In an embodiment the distance between the second transducer 220 and the slide 230 is between 100 and 650 µm, for example between 200 and 600 µm.

Based on conclusions from an experiment with such an arrangement, bubbles 205 attached to a fast moving surface may be prevented from moving into a defined region, such as an optical path OP, by an ultrasonic pressure field that is generated with a standard ultrasonic transducer (e.g. operating at 1.7 MHz). Generation of a pressure gradient, as described below, is effective to stop the passage of a bubble. Typically a pressure gradient amplitude of about $5 \times 10^9$ Pa/m should be sufficient to stop bubbles of about 10 µm diameter at a scan speed of about 0.5 m/s. The power needed to generate this pressure gradient depends on the geometry and losses of the system as well as on the frequency used. For a flat unfocused transducer geometry (for example like that in FIG. 8 or 9) at an operating frequency of 1.7 Mhz and for a distance between the transducer and the facing surface of 200 µm, an acoustic power intensity of higher than 6 W/cm² may be necessary. Additionally or alternatively, the dimension of the transducer through which a path of a bubble would need to take in order to reach the immersion space 11 should be at least 3 mm, or greater than 3.5 mm (which equals about three times the wavelength of the acoustic wave). If a typical transducer efficiency of 60% is taken, the total power intensity of a transducer needed is about 10 W/cm².

In an embodiment, a pressure gradient of greater than $1 \times 10^{10}$ Pa/m is used. In an embodiment, a power intensity of at least 5 W/cm² is used.

The numerical simulations for control of a sessile bubble consisted of various steps. In the calculations it was assumed that the distance between the surface and the transducer was 200 micrometers. The relative speed of the surfaces was about 1 meter per second.

In the numerical simulation, the acoustic pressure field generated by the transducer was computed by Finite Element Modeling using the Helmholtz equation including acoustic dissipation.

$$\nabla \cdot \left(\frac{1}{\rho}\nabla p\right) + \frac{\kappa^2}{\rho}p = 0$$

Here p is acoustic pressure, ρ is density of the liquid and ic is wave number (including attenuation). See "Handbook of Acoustics", Springer, 2007 for further details.

The transient acoustic Bjerknes forces acting on the microbubble was computed by solving the relevant Rayleigh-Plesset equation. The Bjerknes equation is:

$$\rho\left(R\ddot{R} + \frac{3}{2}\dot{R}^2\right) = \left(P_0 + \frac{2\sigma}{R_0} - P_v\right)\left(\frac{R_0}{R}\right)^{3\kappa} - \frac{2\sigma}{R} - \frac{4\mu\dot{R}}{R} - P_0 - P(t)$$

where ρ is density of the liquid, R is radius of bubble, $R_0$ is initial bubble radius, σ is surface tension of the bubble, µ is viscosity of the liquid, P(t) is acoustic pressure, $P_0$ is ambient (hydrostatic) pressure, $P_v$ is the vapor pressure and κ is the polytropic index. The primary Bjerknes force is:

$$F_{AC}(t) = -\frac{4\pi R^3(t)}{3}\nabla P(x, t)$$

where the variables are the same as for the previous equation. P is the acoustic pressure field.

The resulting bubble velocity was determined by solving the momentum balance including added mass, drag, acoustic force, and hysteresis force. The spatial distribution of the acoustic pressure (and its gradient) was taken into account through an iterative routine.

Figure 15:
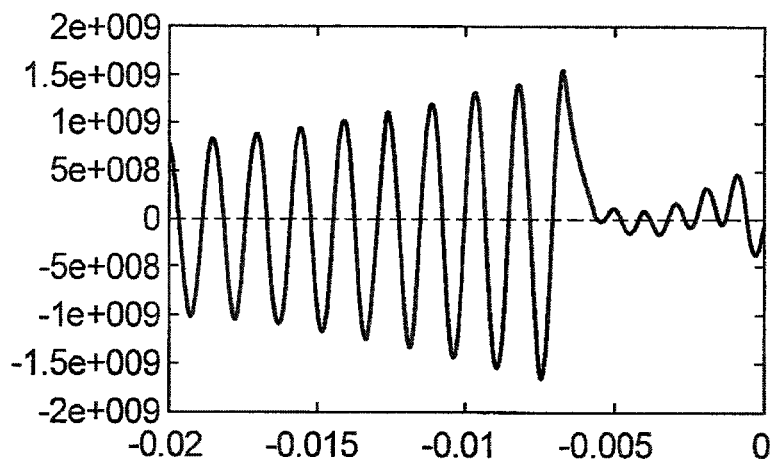
FIG. 15 is a representation of results generated from a model of using ultrasonic waves to stop movement of a bubble with a surface.
Figure 16:
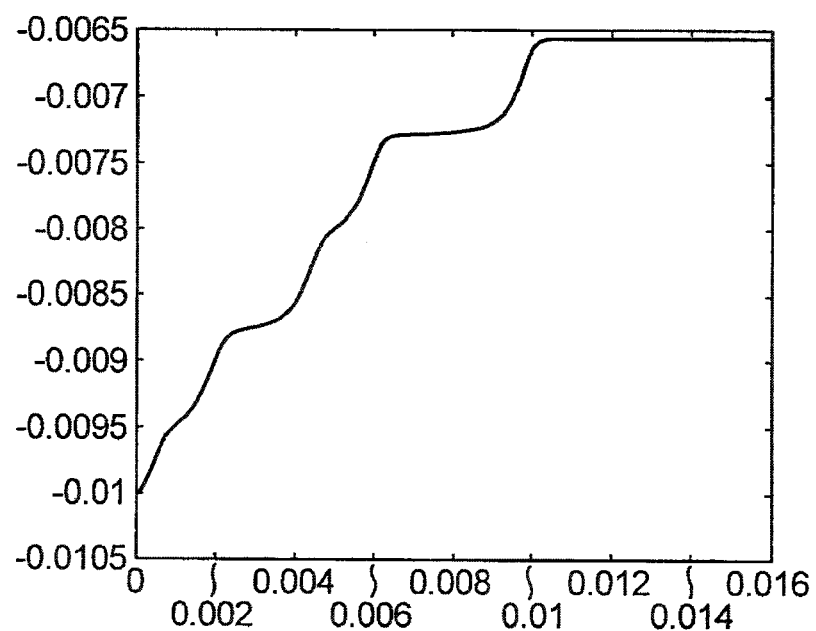
FIG. 16 is a representation of results generated from a model of using ultrasonic waves to stop movement of a bubble with a surface.
Figure 17:
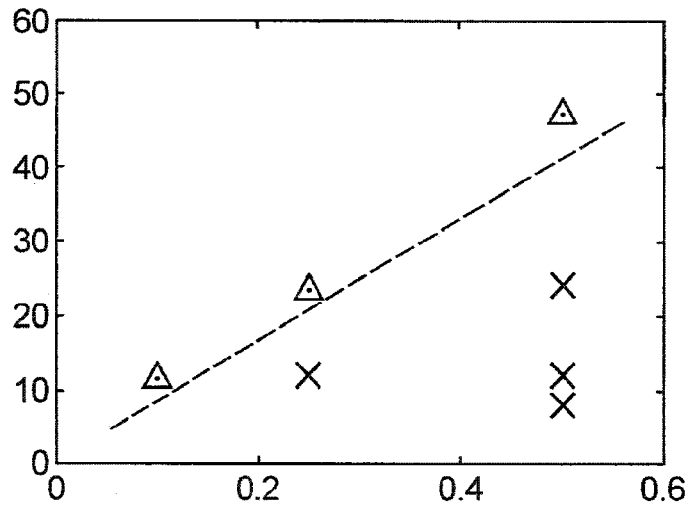
FIG. 17 is a representation of results generated from a model of using ultrasonic waves to stop movement of a bubble with a surface.

FIGS. 15 to 18 show some results of a calculation. FIG. 15 shows the computed ultrasonic pressure field between a 1.7 MHz transducer and a glass slide. FIG. 15 shows the pressure gradient Pa/m between the transducer and glass slide as seen by a 50 µm diameter bubble on the y axis as the slide scans at 0.5 m/s in a horizontal direction (distance in the horizontal direction shown on the x-axis). FIG. 16 shows the position of a 50 µm diameter bubble (on the y axis) as a function of time (x-axis) as the slide scans at 0.5 m/s and transducer power density of 36 W/cm². After some time (about 0.01 seconds) the bubble stops moving (in the ultrasonic field). This means the bubble is stopped from moving with the slide. FIG. 17 shows a graph indicating the required acoustic power (y-axis) to stop a 50 μm diameter bubble as a function of scan speed (x-axis). The distance between the transducer and the slide was 600 μm (as for all of FIGS. 15-17). Crosses show conditions at which bubbles are not stopped and triangles show conditions under which bubbles are stopped.

Figure 18:
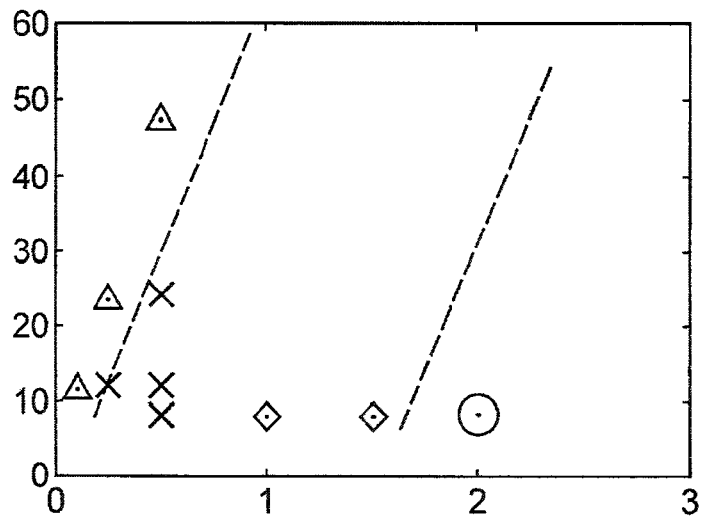
FIG. 18 is a representation of results generated from a model of using ultrasonic waves to stop movement of a bubble with a surface.

FIG. 18 is a similar graph to FIG. 17 except that results for a distance between the transducer and the slide being 200 μm are also plotted. The diamonds show conditions at which bubbles are not stopped and the circle shows conditions under which the bubbles were stopped. As can be seen, the scan speed at which bubbles are stopped is increased for smaller distances between the transducer and the slide, given all the other conditions remain the same.

Figure 19:
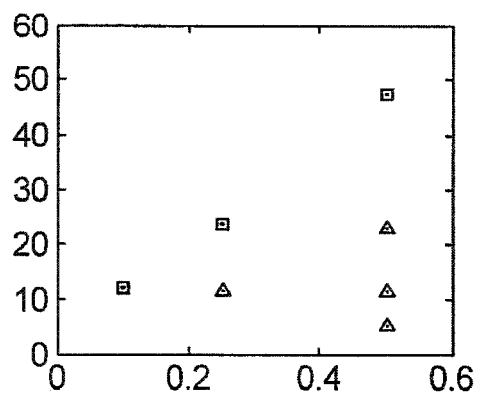
FIG. 19 is a representation of results generated from a model of using ultrasonic waves to stop movement of a bubble with a surface.

FIG. 19 is a graph similar to FIGS. 17 and 18 except that the droplet diameter is 100 μm and the distance between the transducer and the slide was 600 μm. Triangles show conditions at which bubbles are not stopped and squares show conditions under which bubbles are stopped.

Generally, for a given speed, if the input voltage to the transducer is sufficiently high, micro bubbles can be stopped. If the input voltage is too low, the micro bubbles are not stopped and move on with the slide. The effect depends strongly on the distance between the transducer and the slide. For a certain input frequency to the transducer, there is an optimal distance between the transducer and the slide for stopping or deflecting the micro bubbles. Therefore, for instance, at a given frequency and voltage, bubbles may not be stopped at 100, 300 and 600 μm but may be stopped at 400 μm. This effect can be compensated for by increasing the input voltage (and hence acoustic power) or by changing the ultrasound frequency.

Numerical simulations have shown that bubbles with a diameter as small as 5 μm can be stopped. For instance, at a slide scan speed of 0.5 m/s and a distance between the transducer and the slide of 200 μm, using a transducer at 1.7 Mhz and a power density of 6 W/cm$^2$, bubbles can be stopped without deviating much from the other conditions at which experiments of FIG. 16 were performed. This suggests that the method is scalable.

Both the experiments and the simulations show that bubbles can be stopped from moving with a substrate to which they are attached, and are kept steady by the ultrasonic field with a carefully chosen parameter set. For particular experimental conditions, bubbles with a diameter of 100 μm can be stopped for scanning speeds up to 0.5 m/s. For example, for a bubble of about 100 μm diameter attached to a fast moving slide, the bubble may be stopped from moving into a specific region by an ultrasonic pressure field generated by a transducer at a distance 600 μm from the slide, operating at 1.7 MHz and an electrical power density of 19.5 W/cm$^2$ (a power of 26 W). The bubble may be moving with the velocity of the glass slide of 0.5 m/s towards the region. As the bubble reaches the edge of the transducer and its associated acoustic pressure field, the bubble is stopped. Simulations appear to be qualitatively consistent with the experiments, and show that bubbles can be stopped from moving with the scanning slide over a range of velocities. For this reason the frequency and/or power of the transducer may be varied during operation. For example, the frequency and/or power may be operator selected.

In general experimental results and numerical calculations seem to show that there is a strong dependency of the translation speed on frequency of the sonic emission. The optimum operating range may be at a frequency slightly lower than resonant frequency. This is similar to the results reported in Reddy and Szeri, 1346 J. Acoust. Soc. Am. 112 (4), (2002). However it is recognized that this may be conditional on the level of acoustic pressure being the same at different frequencies. In practice, however, the level of acoustic pressure may vary much with frequency. The level of acoustic pressure may depend on the geometry of the arrangement. Therefore in an immersion system, a frequency appropriate to obtain the maximum output acoustic pressure at a preferred distance between the undersurface of the fluid handling structure and the substrate (e.g. the flight height) may be selected. The selected frequency may be about 1.9 MHz (desirably for a flight height of 200 μm). It is then adjusted, i.e. tuned, to optimize the interaction with the size of bubbles to be controlled. Typically the operating frequency range is therefore between 1 and 2.5 MHz, desirably between 1.6 and 2.3 MHz. The operating frequency may be varied during use.

The transducer(s) to stop or deflect bubbles may be positioned in the undersurface 40 of the fluid handling structure 12. The position of the transducer is chosen such that during movement of the facing surface relative to the transducer, particularly scanning movement, a transducer will relatively pass over the area of the facing surface to be scanned prior to the scanning taking place. That is, the transducer will be positioned such that the passage of any bubbles which would otherwise pass into the optical path OP will be blocked or will be defected from that path. The transducer may be positioned in any of the positions illustrated in FIGS. 6-12. The transducer could be placed in the position illustrated in FIG. 13 in order to block the passage of bubbles along the fluid line 43.

In an embodiment, there is provided a fluid handling structure to confine immersion liquid in a space between a projection system and a facing surface of a substrate, of a table to support the substrate, or both, the fluid handling structure comprising a transducer to dissolve at least some of the gas in a bubble in the immersion liquid, the fluid handling structure having an undersurface.

In an embodiment, there is provided a fluid handling structure to confine immersion liquid in a space between a projection system and a facing surface of a substrate, of a table to support the substrate, or both, the fluid handling structure comprising a transducer to prevent a bubble in the immersion liquid from entering the immersion space, the fluid handling structure having an undersurface.

In an embodiment, the transducer is located in the undersurface. In an embodiment, the transducer is radially inward of an extraction opening formed in the undersurface.

In an embodiment, there is provided a fluid handling structure to confine immersion liquid in a space between a projection system and a facing surface of a substrate, of a table to support the substrate, or both, the fluid handling structure comprising a transducer to control a bubble in the immersion liquid so that it avoids entering an optical path of a projection beam from the projection system, the transducer being located in an undersurface of the fluid handling structure radially inward of an extraction opening formed in the undersurface.

In an embodiment, the transducer is at least partly radially inward of a liquid supply opening. In an embodiment, the transducer is at least partly radially outward of a liquid supply opening. In an embodiment, the transducer is at least associated with a preferred relative direction of motion between the facing surface and the undersurface. In an embodiment, the transducer is present at least one corner, in plan, of the undersurface of the fluid handling structure. In an embodiment, the transducer is at least present between corners, in plan, of the undersurface. In an embodiment, the transducer surrounds the immersion space. In an embodiment, the transducer operates at a frequency of more than 850 kHz. In an embodiment, the transducer operates at a frequency of between 1 and 2.5 MHz. In an embodiment, the transducer operates at a frequency between 1.6 and 2.3 MHz, or at 1.9 MHz. In an embodiment, the transducer operates at a frequency which may be varied during use. In an embodiment, the transducer comprises a plurality of transducer elements and at least two of the elements operate at different frequencies. In an embodiment, the transducer is adjacent a fluid line leading to a liquid supply opening in the undersurface. In an embodiment, the transducer is within 800 µm, 600 µm, 400 µm or 200 µm of a surface on which a bubble is expected, in use, to be positioned. In an embodiment, the surface on which a bubble is expected to be positioned is the facing surface. In an embodiment, the transducer is a sonic emitter.

In an embodiment, there is provided a lithographic apparatus comprising the fluid handling structure.

In an embodiment, there is provided a device manufacturing method comprising: projecting, onto a substrate, a patterned beam of radiation along an optical path through an immersion liquid confined by a fluid handling structure to a space between a projection system and the substrate; and using sonic waves to dissolve at least some of the gas in a bubble in the immersion liquid and/or to prevent a bubble in the immersion liquid from entering the optical path.

As will be appreciated, any of the above described features can be used with any other feature and it is not only those combinations explicitly described which are covered in this application.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A fluid handling structure to confine immersion liquid in a space between a projection system and a facing surface of:
a substrate, of a table to support the substrate, or both,
the fluid handling structure comprising a transducer to dissolve at least some of a gas in a bubble in the immersion liquid under the transducer, to prevent a bubble in the immersion liquid under the transducer from entering an immersion space, or both, wherein a side-to-side dimension of the transducer is greater than or equal to a side-to-side dimension of an imaging slit through which a beam of the projection system passes for exposure of the substrate,
the fluid handling structure having an undersurface.

2. The fluid handling structure of claim 1, wherein the transducer is located in the undersurface.

3. The fluid handling structure of claim 1, wherein the transducer is radially inward of an extraction opening formed in the undersurface.

4. The fluid handling structure of claim 1, wherein the transducer is at least partly radially inward of a liquid supply opening.

5. The fluid handling structure of claim 1, wherein the transducer is at least partly radially outward of a liquid supply opening.

6. The fluid handling structure of claim 1, wherein the transducer is at least associated with a preferred relative direction of motion between the facing surface and the undersurface.

7. The fluid handling structure of claim 1, wherein the transducer is present at a corner, in plan, of the undersurface of the fluid handling structure.

8. The fluid handling structure of claim 1, wherein the transducer is at least present between corners, in plan, of the undersurface.

9. The fluid handling structure of claim 1, wherein the transducer surrounds the immersion space.

10. The fluid handling structure of claim 1, wherein the transducer operates at a frequency of more than 850 kHz.

11. The fluid handling structure of claim 10, wherein the transducer operates at a frequency of between 1 and 2.5 MHz.

12. The fluid handling structure of claim 11, wherein the transducer operates at a frequency between 1.6 and 2.3 MHz.

13. The fluid handling structure of claim 1, wherein the transducer operates at a frequency which may be varied during use.

14. The fluid handling structure of claim 1, wherein the transducer comprises a plurality of transducer elements and at least two of the elements operate at different frequencies.

15. The fluid handling structure of claim 1, wherein the transducer is adjacent a fluid line leading to a liquid supply opening in the undersurface.

16. The fluid handling structure of claim 1, wherein the transducer is within 800 µm of a surface on which a bubble is, in use, positioned.

17. The fluid handling structure of claim 16, wherein the surface on which a bubble is expected to be positioned is the facing surface.

18. A lithographic apparatus comprising the fluid handling structure of claim 1.

19. A fluid handling structure to confine immersion liquid in a space between a projection system and a facing surface of a substrate, of a table to support the substrate, or both, the fluid handling structure comprising a transducer to control a bubble in the immersion liquid under the transducer so that it avoids entering an optical path of a projection beam from the projection system, the transducer being located in an undersurface of the fluid handling structure radially inward of an extraction opening formed in the undersurface, wherein a side-to-side dimension of the transducer is greater than or equal to a side-to-side dimension of an imaging slit through which the projection beam passes for exposure of the substrate.

20. A device manufacturing method comprising:

projecting, onto a substrate, a patterned beam of radiation along an optical path through an immersion liquid confined by a fluid handling structure to a space between a projection system and the substrate; and using sonic waves emitted by a transducer to dissolve at least some of a gas in a bubble in the immersion liquid under the transducer and/or to prevent a bubble in the immersion liquid under the transducer from entering the optical path, wherein a side-to-side dimension of the transducer is greater than or equal to a side-to-side dimension of an imaging slit through which the projected beam passes for exposure of the substrate.

* * * * *

UNITED STATES PATENT AND TRADEMARK OFFICE
CERTIFICATE OF CORRECTION

PATENT NO. : 8,711,326 B2
APPLICATION NO. : 13/098830
DATED : April 29, 2014
INVENTOR(S) : Ronald Van Der Ham et al.

Page 1 of 1

It is certified that error appears in the above-identified patent and that said Letters Patent is hereby corrected as shown below:

On title page, item (75) Inventors, Line 8
replace "(NA)"
with --(NL)--.

Signed and Sealed this
Twenty-sixth Day of August, 2014

Michelle K. Lee
*Deputy Director of the United States Patent and Trademark Office*